United States Patent
Chen

(10) Patent No.: US 7,488,571 B2
(45) Date of Patent: *Feb. 10, 2009

(54) METHOD FOR MANUFACTURING LIGHT GUIDE PLATE

(75) Inventor: Ga-Lane Chen, Fremont, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 405 days.

This patent is subject to a terminal disclaimer.

(21) Appl. No.: 11/299,005

(22) Filed: Dec. 9, 2005

(65) Prior Publication Data

US 2006/0127023 A1    Jun. 15, 2006

(30) Foreign Application Priority Data

Dec. 10, 2004  (TW)  ............... 93138295 A

(51) Int. Cl.
*G02B 6/00*   (2006.01)

(52) U.S. Cl. ............... 430/321; 264/1.24; 264/2.5

(58) Field of Classification Search ............... None
See application file for complete search history.

(56) References Cited

U.S. PATENT DOCUMENTS

| 5,776,636 | A  | * | 7/1998 | Kunisawa et al. ............... 430/5 |
| 7,081,332 | B2 | * | 7/2006 | Chen ............... 430/321 |
| 2002/0130427 | A1 | * | 9/2002 | Kobayashi et al. ............... 264/1.6 |
| 2003/0020189 | A1 | * | 1/2003 | Chen et al. ............... 264/1.24 |
| 2005/0194351 | A1 | * | 9/2005 | Yu et al. ............... 216/24 |

FOREIGN PATENT DOCUMENTS

| CN | 1396483 |   | 2/2003 |
| JP | 2001-033634 | * | 2/2008 |
| TW | 522263 |   | 6/2001 |
| TW | 575022 |   | 6/2003 |

OTHER PUBLICATIONS

IBM Technical Disclosure Bulletin, vol. 30, No. 5, pp. 306-311 (Oct. 1987).*
Stephen Y. Chou, Peter R. Krauss, and Preston J. Renstrom; Imprint of sub-25 nm vias and trenches in polymers; p. 3114-3116. vol. 67, Applied Physics Letters 1995.

* cited by examiner

*Primary Examiner*—John A. McPherson
(74) *Attorney, Agent, or Firm*—Andrew C. Cheng

(57) ABSTRACT

A method for manufacturing a light guide plate includes the following steps: (12) providing a photo mask having certain patterns of dots associated therewith; (16) using the photo mask to form an imprinting stamper; and (18) using the imprinting stamper to imprint an original light guide plate, thereby forming a light guide plate having the certain pattern of dots. The dots on the light guide plate manufactured by the present method are fine (i.e., with respect to microstructure), due to a high precision of the imprinting stamper. This precision can result in substantial or even entire uniformity of emitted light beams from the light guide plate. Thus, liquid crystal display devices adopting the light guide plate can provide satisfactory display quality. Therefore, the present method can be advantageously applied in manufacturing the light guide plate used in the liquid crystal display devices.

18 Claims, 1 Drawing Sheet

METHOD FOR MANUFACTURING LIGHT GUIDE PLATE

BACKGROUND

1. Field of the Invention

The invention relates generally to methods for manufacturing light guide plates and, more particularly, to a method for manufacturing a light guide plate used in liquid crystal display devices.

2. Discussion of Related Art

Liquid crystal display devices have many excellent performance characteristics, such as large-scale information display ability, easy to color, low power consumption, long life, no pollution associated therewith, and so on. Therefore, liquid crystal display devices are used widely in such devices as mobile telephones, personal digital assistants (PDA), personal media players (PMP), portable DVD, notebooks, and display devices used in autos. The liquid crystal display devices, however, are passive and can't luminesce. Thus, a typical liquid crystal display device usually adopts a backlight module as its light source. The backlight module generally includes a light guide plate and a light source.

The light source can be located beside one end or beside two opposite ends of the light guide plate and is used to emit incident light beams into the light guide plate. The light guide plate is used to lead travel (i.e., direct) of the incident light beams therein and ensure that most of the incident light beams can be emitted from an emission surface thereof. Thus, by employing such a light guide plate, linear light sources, such as cold cathode ray tubes, or point light sources, such as light emitting diodes, can be converted into area light sources.

In order to enhance a uniformity of the emitted light beams, a plurality of dots can be formed on the emission surface of the light guide plate. The dots are able to break up what could otherwise be a total reflection condition of the incident light beams. This light diffusion ensures that most of the incident light beams can pass through the light emitting surface of the light guide plate.

The light guide plate is generally manufactured by means of injection molding. The injection molding method generally includes the following steps: feedstock is fed in a heated container of an injection molding device and is melted; the molten feedstock is then injected into a mold of the injection molding device; and the molten material is cooled and solidified in the mold to form the light guide plate.

The dots on the light guide plate manufactured by means of injection molding can enhance, to a certain extent, the uniformity of the emitted light beams from the light guide plate. However, a size of each dot is about several tens of micrometers (i.e., from 10 micrometers to 99 micrometers) and is thus not fine (i.e., with respect to the surface microstructure). That is to say, given the limitations on currently-available injection molds, it is difficult to achieve entire or even substantial uniformity of the emitted light beams from the whole area of the light guide plate.

What is needed, therefore, is a method which can manufacture a light guide plate having an array of fine (i.e., with respect to microstructure) dots.

SUMMARY

In one embodiment, a method for manufacturing a light guide plate includes the following steps: providing a photo mask having certain patterns; using the photo mask to form the certain patterns on a silicon wafer by means of lithography imaging, thereby forming an silicon imprinting stamper; and using the silicon imprinting stamper to nano-imprint an original light guide plate, thereby forming a light guide plate having an array of dots in particular patterns.

Alternatively, another embodiment of the method for manufacturing a light guide plate includes the following steps: providing a photo mask having certain patterns; using the photo mask to form the certain patterns on a silicon wafer by means of lithography imaging; using the patterned silicon wafer to form a nickel imprinting stamper; and using the nickel imprinting stamper to nano-imprint an original light guide plate, thereby forming a light guide plate having an array of dots in particular patterns.

Further alternatively, still another embodiment of the method for manufacturing a light guide plate includes the following steps: providing a photo mask having certain patterns; using the photo mask to form a nickel imprinting stamper by means of lithography electroforming micro molding (LIGA) (i.e., LIGA is an abbreviation of a German phrase "Lithographie Galvanoformung Abformung", and an English translation of that phrase is "lithography electroforming micro molding"); and using the nickel imprinting stamper to nano-imprint an original light guide plate thereby forming a light guide plate having an array of dots in particular patterns.

Compared with a conventional manufacturing method, the present method can be used to manufacture a guide plate having fine (i.e., with respect to micro-structure) dots, due to a high precision of the imprinting stamper. This fine dot structuring, in turn, can achieve entire or even substantial uniformity of emitted light beams from the light guide plate. Thus, liquid crystal display devices adopting the light guide plate made by this method can provide satisfactory display quality. Therefore, the present method can be advantageously applied in manufacturing the light guide plates used in the liquid crystal display devices.

Other advantages and novel features of the present method will become more apparent from the following detailed description of preferred embodiments when taken in conjunction with the accompanying drawings.

BRIEF DESCRIPTION OF THE DRAWINGS

Many aspects of the present method for manufacturing a light guide plate can be better understood with reference to the following drawings. The components in the drawings are not necessarily to scale, the emphasis instead being placed upon clearly illustrating the principles of the present method.

Figure 1:
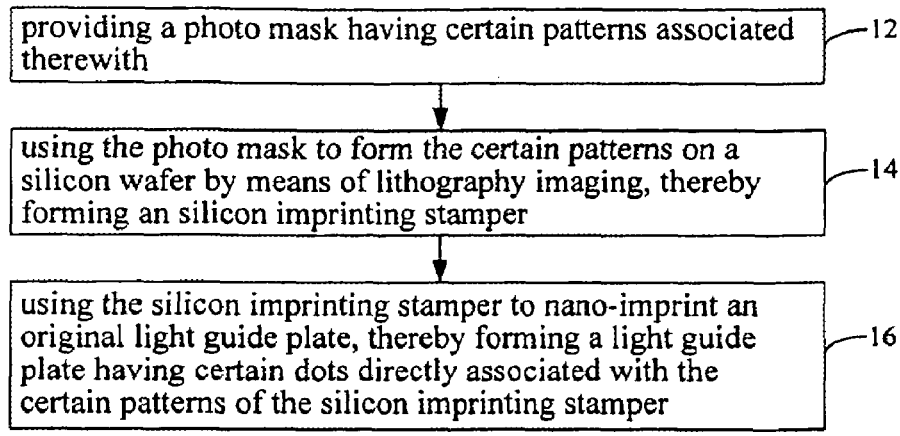
FIG. 1 is a flow chart in accordance with a first embodiment of the present method.

Corresponding reference characters indicate corresponding parts throughout the several views. The exemplifications set out herein illustrate at least one preferred embodiment of the present method, in one form, and such exemplifications are not to be construed as limiting the scope of the present method in any manner.

DETAILED DESCRIPTION OF PREFERRED EMBODIMENTS

Reference will now be made to the drawings to describe embodiments of the present method, in detail.

Referring to FIG. 1, a first embodiment of the present method includes the following steps:

(12) providing a photo mask having certain patterns associated therewith;

(14) using the photo mask to form the certain patterns on a silicon wafer by means of lithography imaging, thereby forming an silicon imprinting stamper; and

(16) using the silicon imprinting stamper to nano-imprint an original light guide plate, thereby forming a light guide plate having certain dots directly associated with the certain patterns of the silicon imprinting stamper.

In step 12, the photo mask is made by the following steps: plating a chrome film on a glass or a silicon dioxide substrate; and forming exposure portions on the substrate by means of ultraviolet radiation exposure or by means of electron beam exposure, thereby selectively removing chrome from the substrate. In this embodiment, the chrome film is plated on a silicon dioxide substrate, and the exposure portions are formed by means of electron beam exposure. The exposure portions on the substrate form the certain patterns. The exposure portions on the substrate are not covered by chrome and can allow light to travel therethrough. The other portions on the substrate are covered by chrome and can prevent light from traveling therethrough.

In step 14, the silicon imprinting stamper is formed by the following steps. Firstly, a photoresist film is formed on the silicon wafer. The photoresist film can be a positive photoresist film or a negative photoresist film. In the illustrated embodiment, the photoresist film is a positive photoresist film. Secondly, the photo mask is placed on the positive photoresist film, and an ultraviolet radiation (µ-ray) exposure process is executed by an aligner or a stepper. Alternatively, an electron beam exposure process can be executed by an electron beam writer. Thus, the photoresist portions of the positive photoresist film, corresponding to the exposure portions of the photo mask, are exposed. Then, the positive photoresist film is immersed in a developer, and the portions of the positive photoresist film that have been exposed are dissolved. Finally, those portions of the silicon wafer that are not covered by the positive photoresist film are etched by means of photo etching or by means of µ-ray developing. Therefore, a plurality of recesses which corresponds to the patterns of the photo mask is formed on the silicon wafer, thereby forming the silicon imprinting stamper.

In step 16, the original light guide plate is made of resin, such as polymethylmethacrylate (PMMA). In the first embodiment, the nano-imprinting process is a hot embossing process and is executed as follows. Firstly, the silicon imprinting stamper and the PMMA are heated to a temperature of about 200° C., which is higher than the glass transition temperature (about 105° C.) of PMMA. Then, the silicon imprinting stamper (specifically the patterned surface thereof) is compressed against the PMMA and is held there until the temperature drops below the PMMA's glass transition temperature. The optimum pressure is about 1900 psi. Thus, the patterns of the silicon imprinting stamper are almost fully, if not totally, transferred into the PMMA, thereby forming the light guide plate having certain dots corresponding to the certain patterns associated with the stamper. It is to be understood that the stamper, in all the various embodiments, operates as a mold in that a face or surface thereof provides a "negative image" of the surface it is used to form. In this case, the patterns of dots formed on the light guide plate are the product of patterns of recesses of shapes mirroring those of the dots. Also, while the stamper is disclosed to be used as a part of a hot embossing procedure, it is to be understood that any molding process incorporating the present stamper and resulting in the desired dot pattern on a light guide plate is considered to be within the scope of the present method.

Because the patterns of the silicon imprinting stamper can be controlled in nano-scale, a size of each dot is in nano-scale. This degree of control over the dot patterning ensures that each dot is fine. Furthermore, the first embodiment is relatively simple, thereby having a relatively low cost associated therewith.

Figure 2:
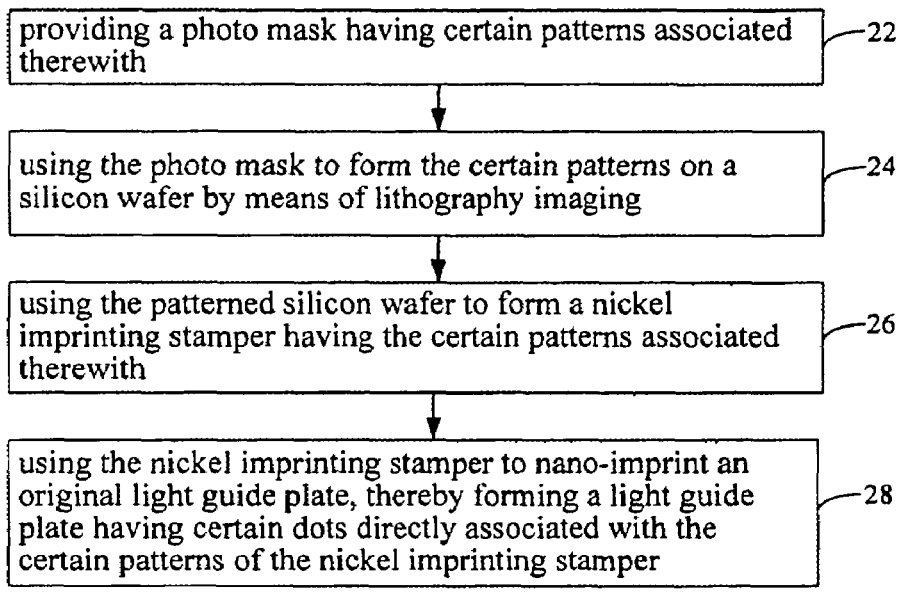
FIG. 2 is a flow chart in accordance with a second embodiment of the present method.

Referring to FIG. 2, a second embodiment of the present method includes the following steps:

(22) providing a photo mask having certain patterns associated therewith;

(24) using the photo mask to form the certain patterns on a silicon wafer by means of lithography imaging;

(26) using the patterned silicon wafer to form a nickel imprinting stamper having the certain patterns associated therewith; and

(28) using the nickel imprinting stamper to nano-imprint an original light guide plate, thereby forming a light guide plate having certain dots directly associated with the certain patterns of the nickel imprinting stamper.

Step 22 is similar to step 12 of the first embodiment, and step 24 is similar to step 14 of the first embodiment. Therefore, detailed descriptions to step 22 and step 24 are not involved here. In step 26, nickel is deposited on the patterned silicon wafer, thereby forming a nickel imprinting stamper with the certain patterns. Furthermore, step 28 is similar to step 16 of the first embodiment, except that the silicon imprinting stamper in step 16 is replaced by the nickel imprinting stamper in step 28.

Because the patterns of the nickel imprinting stamper can be controlled in nano-scale, a size of each dot is in nano-scale (e.g., several tens of nanometers). This pattern control ensures that each dot is fine. Furthermore, because nickel has better toughness than silicon does, the nickel imprinting stamper used in the second embodiment can withstand higher pressure than the silicon imprinting stamper of the first embodiment. Thus, the nickel imprinting stamper used in the second embodiment is more durable.

Figure 3:
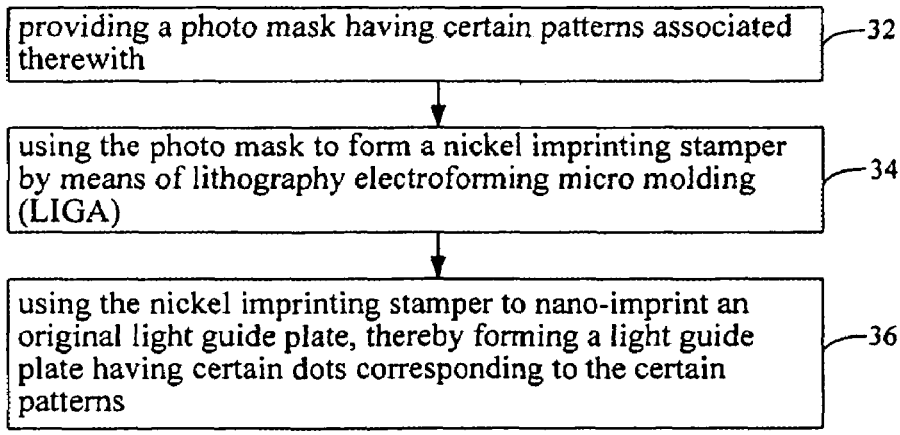
FIG. 3 is a flow chart in accordance with a third embodiment of the present method.

Referring to FIG. 3, a third embodiment of the present method includes the following steps:

(32) providing a photo mask having certain patterns associated therewith;

(34) using the photo mask to form a nickel imprinting stamper by means of lithography electroforming micro molding (LIGA); and

(36) using the nickel imprinting stamper to nano-imprint an original light guide plate, thereby forming a light guide plate having certain dots corresponding to the certain patterns.

Step 32 is similar to step 22 of the second embodiment, and a detailed description to step 32 is thus not presented here. In step 34, the nickel imprinting stamper is formed by the following steps. Firstly, a photoresist film is formed on a substrate. The photoresist film can be a positive photoresist film or a negative photoresist film. In the illustrated embodiment, the photoresist film is a positive photoresist film. Secondly, the photo mask is placed on the positive photoresist film, and an exposure process is executed to the photo mask. Thus, the photoresist portions of the positive photoresist film corresponding to the exposure portions of the photo mask are exposed. Then, the positive photoresist film is immersed in a developer, and the portions of the positive photoresist film that have been exposed are dissolved. Finally, adopting NiP as electrodes and executing a plating process on the substrate, the nickel imprinting stamper is thereby formed. A thickness of the nickel imprinting stamper is in the range from 500 micrometers to 2000 micrometers. Step 36 is similar to step

28 of the second embodiment, and a detailed description of step 36, as such, is not provided here.

Compared with a conventional manufacturing method, the present method can manufacture the light guide plate having fine (i.e., with respect to the surface microstructure thereof) dots, due to a high precision of the imprinting stamper. This fine-dot patterning can promote complete or at least substantial uniformity (i.e., uniformity approached) of emitted light beams from the light guide plate. Thus, liquid crystal display devices adopting the light guide plate can provide satisfactory display quality Therefore, the present method can be advantageously applied in manufacturing the light guide plate used in the liquid crystal display devices.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

I claim:

1. A method for manufacturing a light guide plate, comprising the steps of:
   (a) providing a photo mask having certain patterns associated therewith;
   (b) using the photo mask to form an imprinting stamper with the certain patterns thereby being associated therewith, the certain patterns being nano-scale patterns; and
   (c) using the imprinting stamper to nano-imprint an original light guide plate to form a light guide plate having certain dots directly associated with the certain patterns of the imprinting stamper, each dot being nano-scale in size.

2. The method as claimed in claim 1, wherein the imprinting stamper formed in step (b) is a nickel imprinting stamper.

3. The method as claimed in claim 2, wherein the nickel imprinting stamper is formed by the steps of:
   (b1) funning the certain patterns on a silicon wafer by means of lithography imaging; and
   (b2) using the patterned silicon wafer to form a nickel imprinting stamper.

4. The method as claimed in claim 2, wherein the nickel imprinting stamper is formed by means of lithography electroforming micro molding (LIGA).

5. The method as claimed in claim 1, wherein the imprinting stamper formed in step (b) is a silicon imprinting stamper.

6. The method as claimed in claim 5, wherein the silicon imprinting stamper is formed by means of lithography imaging.

7. The method as claimed in claim 1, wherein step (c) is performed by means of hot embossing.

8. The method as claimed in claim 7, wherein the imprinting stamper formed in step (b) is a nickel imprinting stamper.

9. The method as claimed in claim 8, wherein the nickel imprinting stamper is formed by the steps of:
   (b1) forming the certain patterns on a silicon wafer by means of lithography imaging; and
   (b2) using the patterned silicon wafer to form a nickel imprinting stamper.

10. The method as claimed in claim 8, wherein the nickel imprinting stamper is formed by means of lithography electroforming micro molding (LIGA).

11. The method as claimed in claim 7, wherein the imprinting stamper formed in step (b) is a silicon imprinting stamper.

12. The method as claimed in claim 11, wherein the silicon imprinting stamper is formed means of lithography imaging.

13. A method for manufacturing a light guide plate, comprising the steps of:
    (a) forming an imprinting stamper with certain patterns associated therewith, the certain patterns being nano-scale patterns; and
    (b) using the imprinting stamper to nano-imprint an original light guide plate to form a light guide plate having certain dots directly associated with the certain patterns of the imprinting stamper, each dot being nano-scale in size.

14. The method as claimed in claim 13, wherein step (a) comprises the sub-steps of:
    forming a photo mask; and
    forming the imprinting stamper using the photo mask.

15. The method as claimed in claim 14, wherein the photo mask is formed by:
    plating a chrome film on a substrate; and
    exposing the chrome film to form a certain pattern on the substrate and thereby forming the photo mask.

16. The method as claimed in claim 15, wherein the exposing step comprises an exposure method selected from the group consisting of ultraviolet radiation exposure and electron beam exposure.

17. The method as claimed in claim 14, wherein the imprinting stamper is formed by:
    forming a photoresist film on a silicon wafer;
    placing the photo mask on the formed photoresist film;
    exposing the formed photoresist film with the photo mask thereon; and
    etching the silicon wafer to form certain patterns thereon, thereby forming a silicon imprinting stamper.

18. The method as claimed in claim 14, wherein the imprinting stamper is formed by:
    forming a photoresist film on a silicon wafer;
    placing the photo mask on the formed photoresist film;
    exposing the fanned photoresist film with the photo mask thereon;
    etching the silicon wafer to form certain patterns thereon; and
    disposing nickel on the patterned silicon wafer, thereby forming a nickel imprinting stamper.

* * * * *